(12) United States Patent
Lim (10) Patent No.: US 10,916,277 B2
(45) Date of Patent: Feb. 9, 2021

(54) MEMORY DEVICE AND OPERATING METHOD THEREOF

(71) Applicant: SK hynix Inc., Gyeonggi-do (KR)

(72) Inventor: Sang Oh Lim, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/549,388

(22) Filed: Aug. 23, 2019

(65) Prior Publication Data
US 2020/0143856 A1 May 7, 2020

(30) Foreign Application Priority Data
Nov. 2, 2018 (KR) .......................... 10-2018-0133599

(51) Int. Cl.
*G11C 7/22* (2006.01)
*G11C 7/10* (2006.01)
*G11C 15/04* (2006.01)

(52) U.S. Cl.
CPC ............ *G11C 7/222* (2013.01); *G11C 7/1063* (2013.01); *G11C 7/1069* (2013.01); *G11C 15/04* (2013.01)

(58) Field of Classification Search
CPC ..... G11C 7/222; G11C 7/1063; G11C 7/1069; G11C 15/04

USPC ....................................................... 365/49.1
See application file for complete search history.

(56) References Cited

U.S. PATENT DOCUMENTS

| | | | | |
|---|---|---|---|---|
| 9,490,030 | B2* | 11/2016 | Kang | G11C 7/222 |
| 10,170,170 | B2* | 1/2019 | Ware | G11C 5/02 |
| 10,305,589 | B2* | 5/2019 | Wang | H04L 25/03019 |
| 2019/0180805 | A1* | 6/2019 | Ware | G11C 29/023 |
| 2019/0245617 | A1* | 8/2019 | Wang | H04L 25/03 |

FOREIGN PATENT DOCUMENTS

| | | |
|---|---|---|
| KR | 10-2009-0002385 | 1/2009 |
| KR | 10-2009-0015723 | 2/2009 |

* cited by examiner

*Primary Examiner* — Fernando Hidalgo
(74) *Attorney, Agent, or Firm* — IP & T Group LLP (57) ABSTRACT

A memory device includes a memory cell array including a plurality of memory blocks and a storage block storing a plurality of pieces of option parameter information; a parameter determining circuit outputting a parameter information signal by measuring a skew of the memory device; a peripheral circuit performing a read operation on the storage block; and a control logic controlling the peripheral circuit to perform the read operation on a selected piece of option parameter information, among the plurality of pieces of option parameter information, in response to the parameter information signal, and setting an option parameter according to the selected piece of option parameter information.

19 Claims, 10 Drawing Sheets

MEMORY DEVICE AND OPERATING METHOD THEREOF

CROSS-REFERENCE TO RELATED APPLICATION

The present application claims priority under 35 U.S.C. § 119(a) to Korean patent application number 10-2018-0133599, filed on Nov. 2, 2018, the entire disclosure of which is incorporated herein by reference in its entirety.

BACKGROUND

1. Field of Invention

Various embodiments relate generally to a memory device and an operating method thereof, and more particularly, to a memory device capable of setting an optimal option parameter and an operating method thereof.

2. Description of Related Art

Recently, a paradigm for computer environment has changed into ubiquitous computing which makes a computer system available at any time from any location. Therefore, the use of portable electronic devices, such as cellular phones, digital cameras, and laptop computers, has surged. A portable electronic device generally uses a memory system using a memory device, i.e., a data storage device. The data storage device may serve as a main storage device or an auxiliary storage device of the portable electronic device.

A data storage device using a memory device has excellent stability and durability since it does not have any mechanical driving parts. In addition, the data storage device also provides very high information access speed and low power consumption. The data storage device as an example of the memory system having these advantages may include a universal serial bus (USB), a memory card having various interfaces, and a solid state drive (SSD).

SUMMARY

Various embodiments of the present disclosure provide a memory device capable of controlling option parameter settings according to a skew value of the memory device, and an operating method thereof.

In accordance with an embodiment, a memory device may include a memory cell array including a plurality of memory blocks and a storage block storing a plurality of pieces of option parameter information; a parameter determining circuit outputting a parameter information signal by measuring a skew of the memory device; a peripheral circuit performing a read operation on the storage block; and a control logic controlling the peripheral circuit to perform the read operation on a selected piece of option parameter information, among the plurality of pieces of option parameter information, in response to the parameter information signal, and setting an option parameter according to the selected piece of option parameter information.

In accordance with an embodiment, a memory device may include a memory cell array including a CAM (Content Addressable Memory) block storing a plurality of CAM data; a skew determination circuit outputting a skew value signal by measuring a skew of the memory device; a peripheral circuit performing a CAM data read operation for the CAM block; and a control logic controlling the peripheral circuit to perform the CAM data read operation for CAM data, selected from among the plurality of CAM data, in response to the skew value signal.

In accordance with an embodiment, a method of operating a memory device may include storing a plurality of CAM data in a CAM block, measuring a skew of the memory device during a power-on operation, performing a CAM data read operation by selecting one of the plurality of CAM data according to the skew, setting an option parameter according to CAM data read as a result of the CAM data read operation, and performing various operations according to the option parameter.

DETAILED DESCRIPTION

Hereinafter, specific structural or functional descriptions of examples of embodiments in accordance with concepts which are disclosed in this specification are illustrated only to describe the examples of embodiments in accordance with the concepts, and the examples of embodiments in accordance with the concepts may be carried out by various forms but the descriptions are not limited to the examples of embodiments described in this specification.

Various modifications and changes may be applied to the examples of embodiments in accordance with the concepts so that the examples of embodiments will be illustrated in the drawings and described in the specification. However, the embodiments in accordance with the concept of the present disclosure are not construed as limited to specified disclosures, and include all changes, equivalents, or substitutes that do not depart from the spirit and technical scope of the present disclosure.

While terms such as "first" and "second" may be used to describe various components, such components must not be understood as being limited to the above terms. The above terminologies are used to distinguish one component from the other component, for example, a first component may be referred to as a second component without departing from the concept of the present disclosure and similarly, a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "~ between," "immediately ~ between" or "adjacent to ~" and "directly adjacent to ~" may be construed similarly.

The terms used in the present application are merely used to describe particular embodiments, and are not intended to limit the present disclosure. Singular forms in the present disclosure are intended to include the plural forms as well, unless the context clearly indicates otherwise. In the present specification, it should be understood that terms "include" or "have" indicate that a feature, a number, a step, an operation, a component, a part or the combination of those described in the specification is present, but do not exclude a possibility of presence or addition of one or more other features, numbers, steps, operations, components, parts or combinations thereof, in advance.

So far as not being differently defined, all terms used herein including technical or scientific terminologies have meanings that are commonly understood by those skilled in the art to which the present disclosure pertains. The terms defined in generally used dictionaries should be construed as having the same meanings as would be construed in the context of the related art, and unless clearly defined otherwise in this specification, should not be construed as having idealistic or overly formal meanings.

In some embodiments, well-known processes, device structures, and technologies will not be described in detail to avoid ambiguousness of the present invention. The intent is to disclose the gist of the present disclosure more clearly by omitting unnecessary description.

Hereinafter, exemplary embodiments of the present disclosure will be described in detail with reference to the accompanying drawings in order for those skilled in the art to be able to readily implement the technical spirit of the present disclosure.

Figure 1:
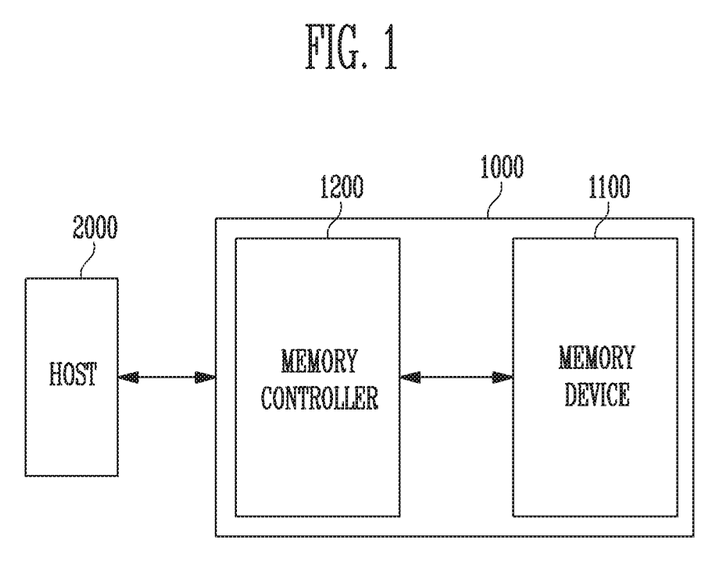
FIG. 1 is a diagram illustrating a memory system in accordance with an embodiment of the present disclosure.

FIG. 1 is a diagram illustrating a memory system 1000 in accordance with an embodiment of the present disclosure.

Referring to FIG. 1, the memory system 1000 may include a memory device 1100 storing data and a memory controller 1200 controlling the memory device 1100 in response to control of a host 2000.

The host 2000 may communicate with the memory system 1000 using an interface protocol such as Peripheral Component Interconnect-Express (PCI-e or PCIe), Advanced Technology Attachment (ATA), Serial ATA (SATA), Parallel ATA (PATA), or serial attached SCSI (SAS). In addition, the interface protocols provided for the purpose of data communication between the host 2000 and the memory system 1000 may not be limited to the above examples and may be one of interface protocols such as a Universal Serial Bus (USB), a Multi-Media Card (MMC), an Enhanced Small Disk Interface (ESDI), and Integrated Drive Electronics (IDE).

The memory controller 1200 may control various operations of the memory system 1000 and control data exchange between the host 2000 and the memory device 1100. For example, the memory controller 1200 may program or read data, or erase the programmed data by controlling the memory device 1100 according to a program command, a read command, or an erase command received from the host 2000. For example, when the memory controller 1200 receives the program command, the read command, or the erase command from the host 2000, the memory controller 1200 may generate an internal command corresponding to each command and output the internal command to the memory device 1100.

The memory controller 1200 may control the memory device 1100 to perform a program, read, or erase operation. In accordance with an embodiment, the memory device 1100 may include Double Data Rate Synchronous Dynamic Random Access Memory (DDR SDRAM), Low Power Double Data Rate4 (LPDDR4) SDRAM, Graphics Double Data Rate (GDDR) SDRAM, Low Power DDR (LPDDR), Rambus Dynamic Random Access Memory (RDRAM), or FLASH Memory.

The memory device 1100 may store a plurality of CAM (Content Addressable Memory) data corresponding to a plurality of pieces of option parameter information, respectively. In addition, during a power-on operation, the memory device 1100 may measure a skew value of the memory device 1100, read CAM data corresponding to the measured skew value, among the plurality of CAM data, and set an option parameter for various operations according to the read CAM data.

In accordance with an embodiment of the present invention, it is described and illustrated that the memory system 1000 includes one memory device 1100. However, the memory system 1000 may include a plurality of memory devices 1100. The plurality of memory devices 1100 may set the same or different option parameters according to skew values thereof.

Figure 2:
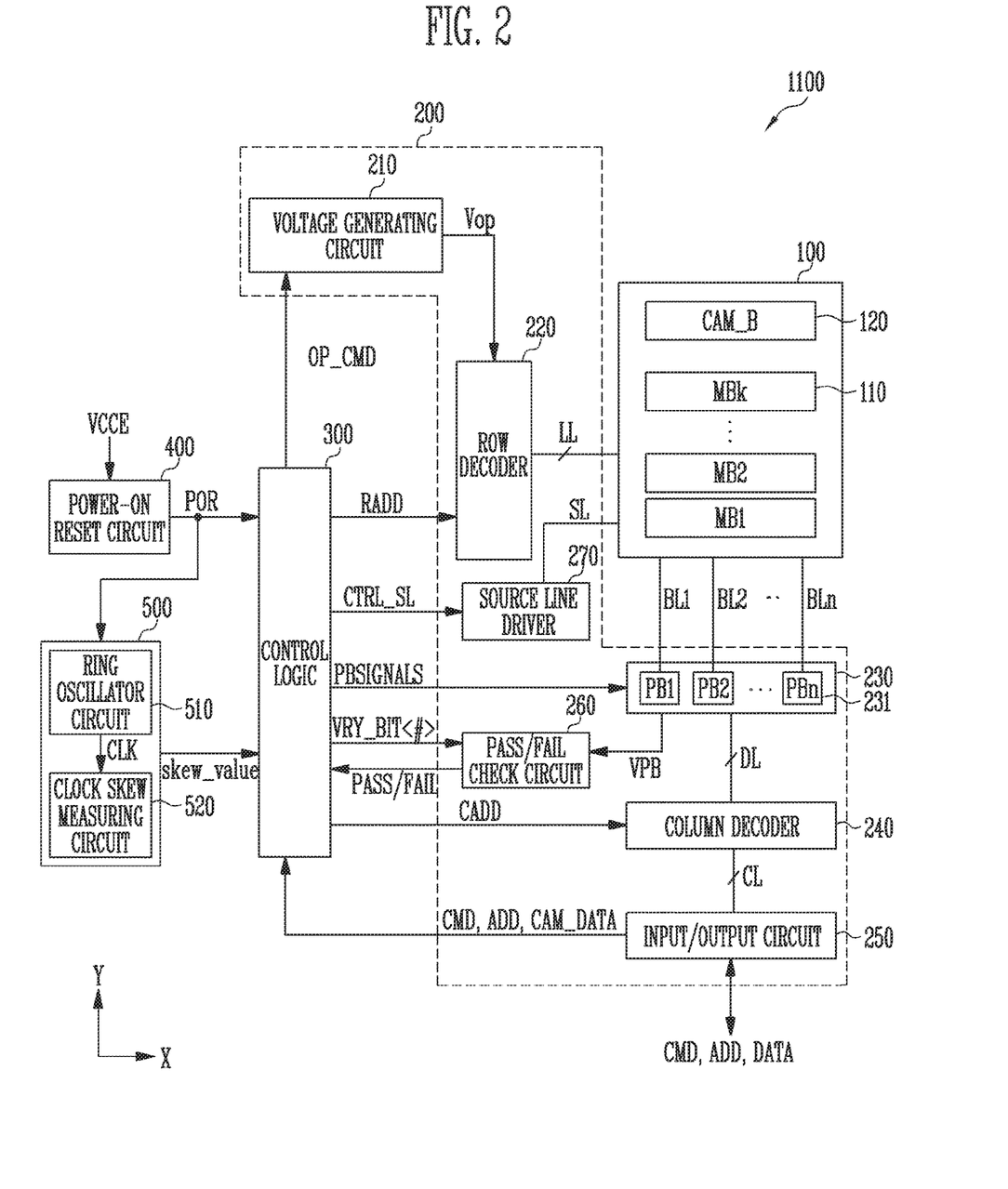
FIG. 2 is a diagram illustrating a memory device shown in FIG. 1.

FIG. 2 is a diagram illustrating the memory device 1100 shown in FIG. 1.

Referring to FIG. 2, the memory device 1100 may include a memory cell array 100 storing data. The memory device 1100 may include a peripheral circuit 200 configured to perform a program operation to store data in the memory cell array 100, a read operation to output the stored data, and an erase operation to erase the stored data. The memory device 1100 may include a control logic 300 configured to control the peripheral circuit 200 in response to control of a controller (e.g., the memory controller 1200 shown in FIG. 1).

The memory cell array 100 may include a plurality of memory blocks MB1 to MBk, where k is a positive integer, and at least one CAM block (CAM_B) 120. Local lines LL and bit lines BL1 to BLn may be coupled to each of the memory blocks MB1 to MBk (110), where n is a positive integer. For example, the local lines LL may include a first select line, a second select line, and a plurality of word lines arranged between the first and second select lines. In addition, the local lines LL may include dummy lines arranged between the first select line and the word lines, and between the second select line and the word lines. The first select line may be a source select line, and the second select line may be a drain select line. For example, the local lines LL may include word lines, drain and source select lines, and source lines. Further, the local lines LL may further include dummy lines. Furthermore, the local lines LL may further include pipe lines. The local lines LL may be coupled to the memory blocks (MB1 to MBk) 110, respectively, and the bit lines BL1 to BLn may be commonly coupled to the memory blocks (MB1 to MBk) 110. The memory blocks (MB1 to MBk) 110 may have a two-dimensional or three-dimensional structure. In the 2D memory blocks 110, memory cells may be arranged in parallel with a substrate. In the 3D memory blocks 110, memory cells may be stacked in a vertical direction to the substrate. At least one CAM block 120 may be designed to have the same structure as the memory blocks (MB1 to MBk) 110. In addition, at least one of the memory blocks (MB1 to MBk) 110 may be selected as the CAM block 120. At least one CAM block 120 may store a plurality of CAM data corresponding to a plurality of pieces of option parameter information, respectively. In other words, the one CAM block 120 may be a storage block for storing a plurality of CAM data.

The peripheral circuit 200 may be configured to perform program, read and erase operations on the selected memory block 110 in response to control of the control logic 300. In addition, the control logic 300 may control the peripheral circuit 200 to read CAM data, selected from among the plurality of CAM data stored in the CAM block 120, and output the read CAM data to the control logic 300 after a power-on reset operation.

For example, the peripheral circuit 200 may include a voltage generating circuit 210, a row decoder 220, a page buffer group 230, a column decoder 240, an input and output (input/output) circuit 250, a pass and fail (pass/fail) check circuit 260, and a source line driver 270.

The voltage generating circuit 210 may generate various operating voltages Vop used to perform program, read and erase operations in response to an operation signal OP_CMD. For example, the control logic 300 may control the voltage generating circuit 210 to generate a program voltage, a verify voltage, pass voltages, a read voltage, and a source line voltage.

The row decoder 220 may transfer the operating voltages Vop to the local lines LL coupled to the selected memory block 110 in response to a row address RADD.

The page buffer group 230 may include a plurality of page buffers (PB1 to PBn) 231 coupled to the bit lines BL1 to BLn. The page buffers (PB1 to PBn) 231 may operate in response to page buffer control signals PBSIGNALS. For example, the page buffers (PB1 to PBn) 231 may temporarily store data received through data lines DL and control voltage levels of the bit lines BL1 to BLn in response to the temporarily stored data during a program operation, or may sense voltages or currents in the bit lines BL1 to BLn during a read or verify operation.

The column decoder 240 may transfer data between the input/output circuit 250 and the page buffer group 230 in response to a column address CADD. For example, the column decoder 240 may exchange data with the page buffers 231 through the data lines DL, or may exchange data with the input/output circuit 250 through column lines CL.

The input/output circuit 250 may transfer an internal command CMD and an address ADD from the memory controller 1200 of FIG. 1 to the control logic 300, or may exchange data DATA with the column decoder 240. In addition, the input/output circuit 250 may output CAM data CAM_DATA read during a CAM data read operation to the control logic 300.

The pass/fail check circuit 260 may generate a reference current in response to an allowable bit VRY_BIT<#> and may compare a sensing voltage VPB received from the page buffer group 230 with a reference voltage generated by the reference current to output a pass signal PASS or a fail signal FAIL during a read operation or a verify operation.

The source line driver 270 may be coupled to memory cells included in the memory cell array 100 through a source line SL and may control a voltage of a source node. For example, the source line driver 270 may electrically couple a source node of a memory cell to a ground node during a read or verify operation. In addition, the source line driver 270 may apply a ground voltage to the source node of the memory cell during a program operation. The source line driver 270 may apply an erase voltage to the source node of the memory cell during an erase operation. The source line driver 270 may receive a source line control signal CTRL_SL from the control logic 300 and control a voltage of the source node on the basis of the source line control signal CTRL_SL.

The control logic 300 may control the peripheral circuit 200 by outputting the operation signal OP_CMD, the row address RADD, the column address CADD, the page buffer control signals PBSIGNALS, and the allowable bit VRY_BIT<#> in response to the internal command CMD and the address ADD. In addition, the control logic 300 may determine whether a verify operation passes or fails in response to the pass or fail signal PASS or FAIL.

A power-on reset circuit 400 may generate and output a power-on reset signal POR by detecting an increase of an external power voltage VCCE to more than a predetermined level during a power-on operation.

A parameter determining circuit 500 may measure a parameter value of the memory device 1100, and may generate and output a signal corresponding to the measured parameter value in response to the power-on reset signal POR. For example, the parameter determining circuit 500 may be a skew determination circuit which is configured to measure a skew value, and generate and output a skew value signal skew_value corresponding to a parameter information signal in response to the power-on reset signal POR. The parameter determining circuit 500 may include a ring oscillator circuit 510 and a clock skew measuring circuit 520. The ring oscillator circuit 510 may generate a clock signal CLK whose period is changed by reflecting process, voltage and temperature (PVT) variations of elements. The clock skew measuring circuit 520 may count the number of toggles of the clock signal CLK during a predetermined time and measure the skew value of the memory device 1100 according to the toggle count. In addition, the clock skew measuring circuit 520 may measure the skew value of the memory device 1100 by comparing a reference clock having a predetermined toggle period with the clock signal CLK.

In other words, the parameter determining circuit 500 may generate and output the skew value signal skew_value corresponding to the skew value determined according to the period of the clock generated by the ring oscillator circuit 510.

The control logic 300 may perform an initialization operation in response to the power-on reset signal POR. In response to the skew value signal skew_value, the control logic 300 may control the peripheral circuit 200 to select optimal CAM data, among the plurality of CAM data stored in the CAM block 120, and to perform a CAM data read operation for reading the selected CAM data. In addition, the control logic 300 may perform various operations after setting option parameters of the memory device 1100 according to the read CAM data.

Figure 3:
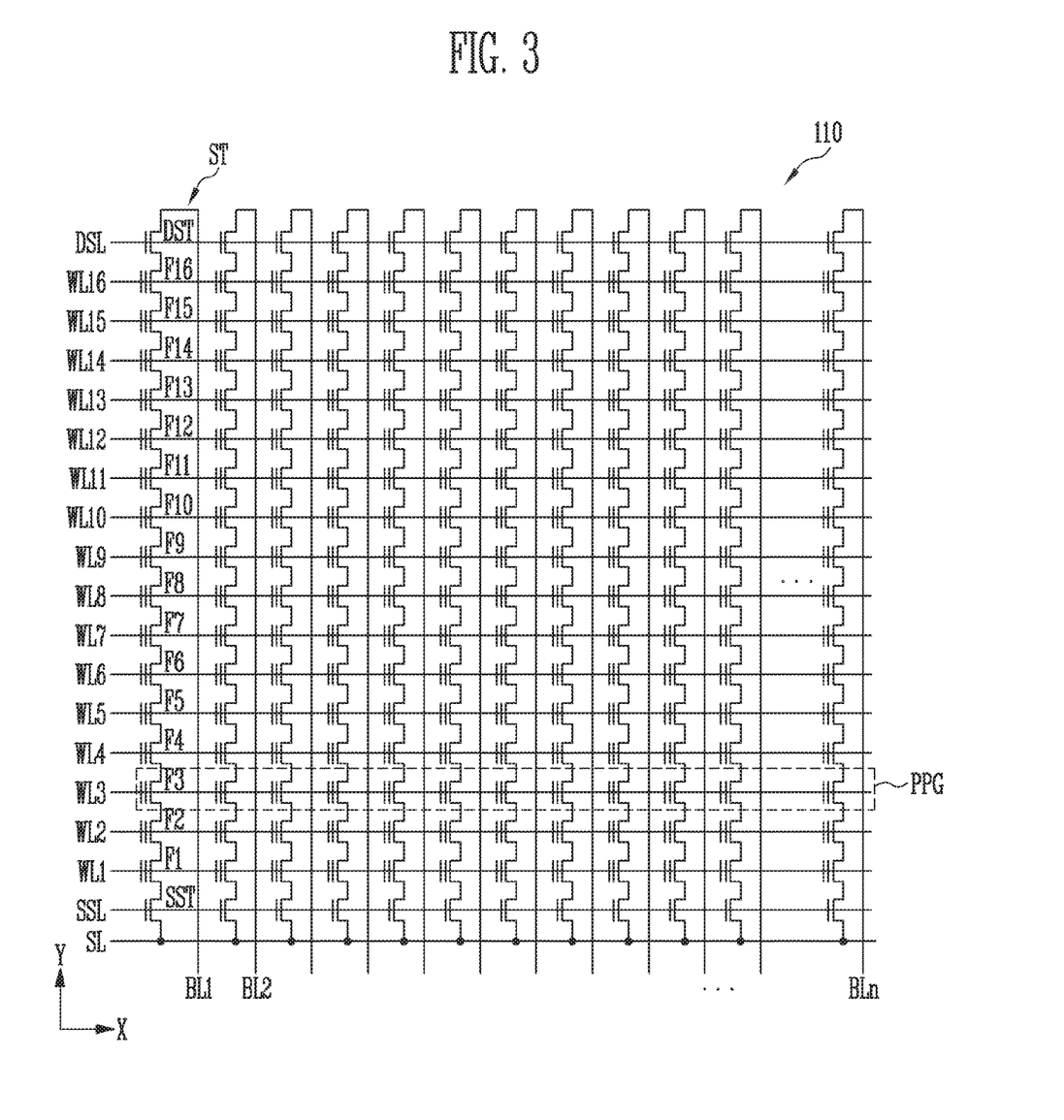
FIG. 3 is a diagram illustrating a memory block shown in FIG. 2.

FIG. 3 is a diagram illustrating the memory block 110 shown in FIG. 2.

Referring to FIG. 3, the memory block 110 may be configured such that a plurality of word lines which are arranged in parallel may be coupled between a first select line and a second select line. The first select line may be a source select line SSL and the second select line may be a drain select line DSL. More specifically, the memory block 110 may include a plurality of strings ST coupled between the bit lines BL1 to BLn and the source line SL. Each of the bit lines BL1 to BLn may be coupled to each of the strings ST, and the source line SL may be commonly coupled to the strings ST. Since the strings ST may have the same configuration, the string ST coupled to the first bit line BL1 will be described in detail by way of example.

The string ST may include a source select transistor SST, a plurality of memory cells F1 to F16, and a drain select transistor DST coupled in series between the source line SL and the first bit line BL1. Each string ST may include at least one source select transistor SST, at least one drain select transistor DST, and more memory cells than the memory cells F1 to F16 as shown in FIG. 3.

A source of the source select transistor SST may be coupled to the source line SL and a drain of the drain select transistor DST may be coupled to the first bit line BL1. The memory cells F1 to F16 may be coupled in series between the source select transistor SST and the drain select transistor DST. Gates of the source select transistors SST included in different strings ST may be coupled to the source select line SSL. Gates of the drain select transistors DST may be coupled to the drain select line DSL. Gates of the memory cells F1 to F16 may be coupled to a plurality of word lines WL1 to WL16. A group of memory cells coupled to the same word line, among memory cells included in different strings ST, may be referred to as a physical page PPG. Therefore, the memory block 110 may include as many physical pages PPG as the number of word lines WL1 to WL16.

A single memory cell may store one bit of data. This memory cell is generally called a single level cell (SLC). A single physical page PPG may store data corresponding to a single logical page LPG. Data corresponding to the single logical page LPG may include as many data bits as the number of cells included in the single physical page PPG. In addition, a single memory cell may store two or more bits of data. This cell is typically referred to as a "multi-level cell (MLC)". The single physical page PPG may store data corresponding to two or more logical pages LPG.

The source select transistor SST and the drain select transistor DST may be programmed to have predetermined threshold voltages, and turned on or off by operating voltages applied through the source select line SSL and the drain select line DSL during various operations including a program operation, a read operation, and an erase operation.

Figure 4:
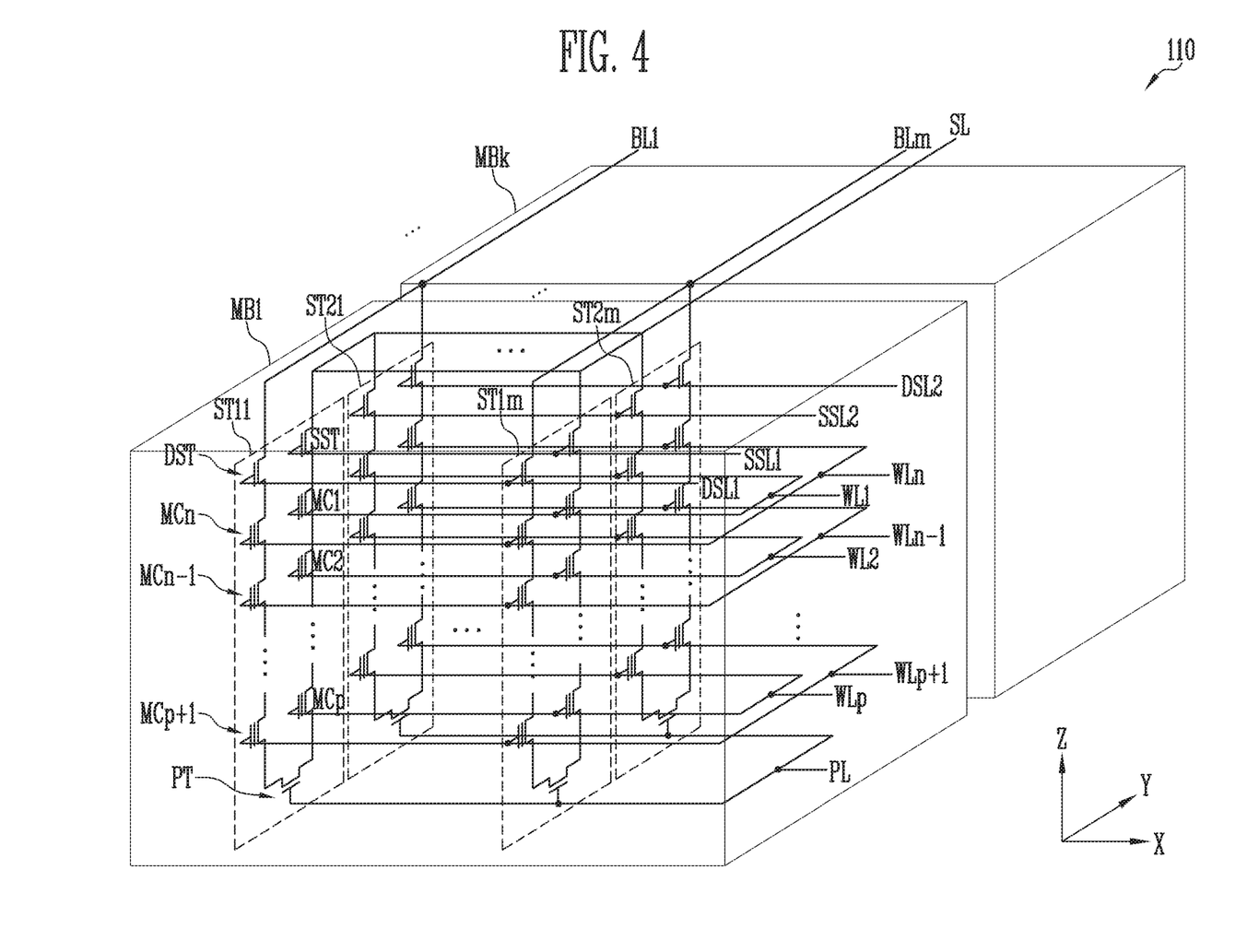
FIG. 4 is a diagram illustrating an example of a three-dimensionally structured memory block.

FIG. 4 is a diagram illustrating an example of a memory block having a three-dimensional structure.

Referring to FIG. 4, the memory cell array 100 may include the plurality of memory blocks (MB1 to MBk) 110. The memory block 110 may include a plurality of strings ST11 to ST1*m* and ST21 to ST2*m*. In accordance with an embodiment, each of the plurality of strings ST11 to ST1*m* and ST21 to ST2*m* may have a 'U' shape. In the first memory block MB1, 'm' strings may be arranged in a row direction (i.e., X direction). Although FIG. 4 illustrates two strings arranged in a column direction (i.e., Y direction), three or more strings may be arranged in the column direction (i.e., Y direction).

Each of the plurality of strings ST11 to ST1*m* and ST21 to ST2*m* may include at least one source select transistor SST, first to nth memory cells MC1 to MCn, a pipe transistor PT, and at least one drain select transistor DST.

The source and drain select transistors SST and DST and the memory cells MC1 to MCn may have similar structures to each other. For example, each of the source and drain select transistors SST and DST and the memory cells MC1 to MCn may include a channel layer, a tunnel insulating layer, a charge trap layer, and a blocking insulating layer. For example, a pillar for forming a channel layer may be provided in each string. For another example, a pillar for forming at least one of the channel layer, the tunnel insulating layer, the charge trap layer, and the blocking insulating layer may be provided in each string.

The source select transistor SST of each string ST may be coupled between the source line SL and memory cells MC1 to MCp.

In accordance with an embodiment, source select transistors of strings arranged in the same row may be coupled to a source select line extending in the row direction, and source select transistors of strings arranged in different rows may be coupled to different source select lines. As shown in FIG. 4, source select transistors of the strings ST11 to ST1*m* in the first row may be coupled to a first source select line SSL1, and the source select transistors of the strings ST21 to ST2*m* in the second row may be coupled to a second source select line SSL2.

In accordance with another embodiment, the source select transistors of the strings ST11 to ST1*m* and ST21 to ST2*m* may be commonly coupled to one source select line.

The first to nth memory cells MC1 to MCn of each string may be coupled between the source select transistor SST and the drain select transistor DST.

The first to nth memory cells MC1 to MCn may be divided into the first to pth memory cells MC1 to MCp and (p+1)th to nth memory cells MCp+1 to MCn. The first to pth memory cells MC1 to MCp may be sequentially arranged in a vertical direction (i.e., Z direction) and be coupled in series between the source select transistor SST and the pipe transistor PT. The (p+1)th to nth memory cells MCp+1 to MCn may be sequentially arranged in the vertical direction (i.e., Z direction) and be coupled in series between the pipe transistor PT and the drain select transistor DST. The first to pth memory cells MC1 to MCp and the (p+1)th to nth memory cells MCp+1 to MCn may be coupled to each other through the pipe transistor PT. Gates of the first to nth memory cells MC1 to MCn of each string may be coupled to the first to nth word lines WL1 to WLn, respectively.

In accordance with an embodiment, at least one of the first to nth memory cells MC1 to MCn may serve as a dummy memory cell. When the dummy memory cell is provided, a voltage or current of the corresponding string may be stably controlled. A gate of the pipe transistor PT of each string may be coupled to a pipe line PL.

The drain select transistor DST of each string may be coupled between the corresponding bit line and the memory cells MCp+1 to MCn. Strings arranged in the row direction may be coupled to the corresponding drain select line extending in the row direction. The drain select transistors of the strings ST11 to ST1*m* in the first row may be coupled to a drain select line DSL1. The drain select transistors of the strings ST21 to ST2*m* in the second row may be coupled to a second drain select line DSL2.

Strings arranged in the column direction may be coupled to bit lines extending in the column direction. As shown in FIG. 4, the strings ST11 and ST21 in the first column may be coupled to the first bit line BL1. The strings ST1*m* and ST2*m* in the mth column may be coupled to the mth bit line BLm.

Memory cells coupled to the same word line, among strings arranged in the row direction, may form a single page. For example, memory cells coupled to the first word line WL1, among the strings ST11 to ST1*m* in the first row, may constitute one page. Memory cells coupled to the first word line WL1 in the strings ST21 to ST2m in the second row may constitute one additional page. When one of the drain select lines DSL1 and DSL2 is selected, strings arranged in one row direction may be selected. One page of selected strings may be selected when one of the word lines WL1 to WLn is selected.

Figure 5:
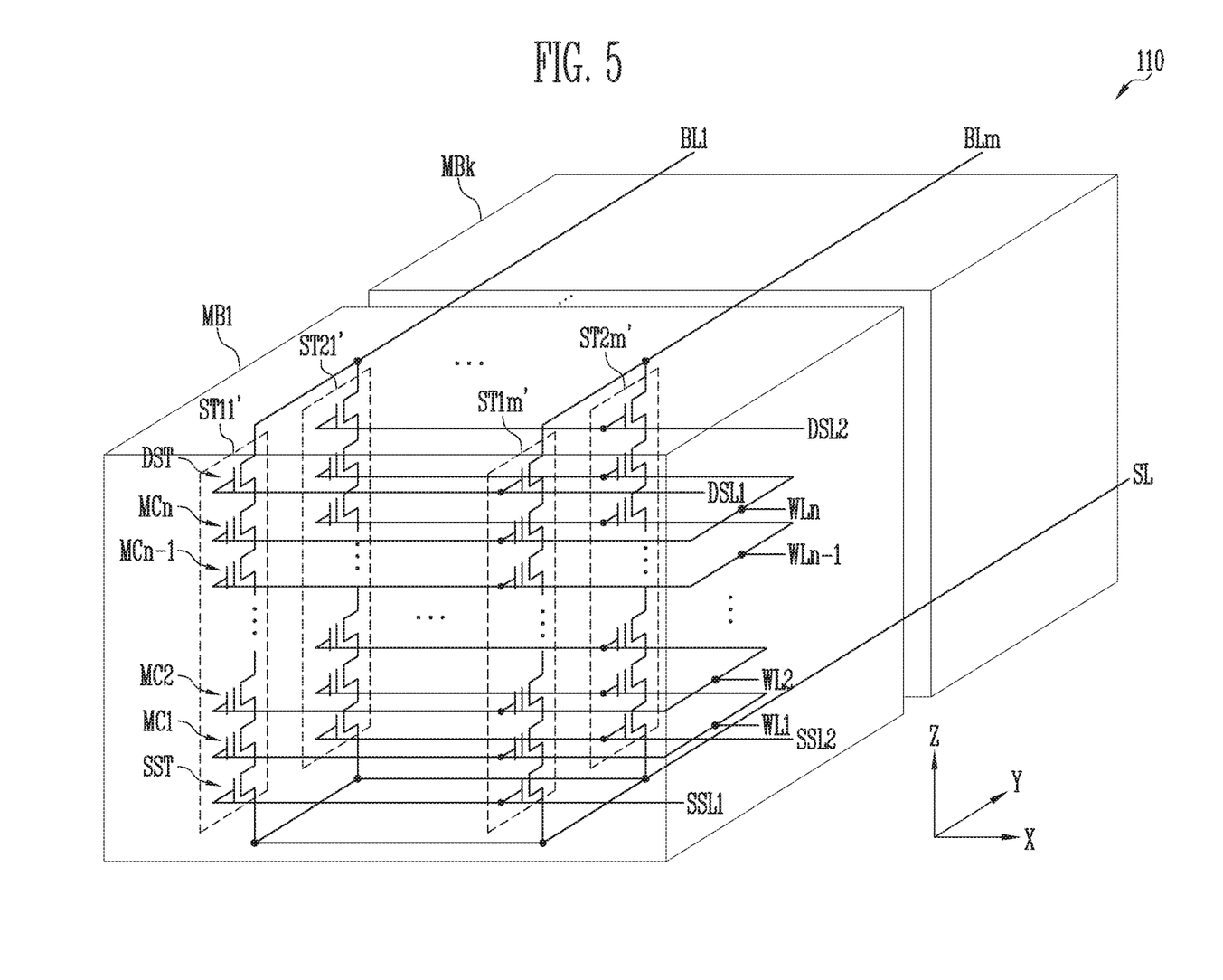
FIG. 5 is a diagram illustrating another example of a three-dimensionally structured memory block.

FIG. 5 is a diagram illustrating an example of a memory block having a three-dimensional structure.

Referring to FIG. 5, the memory cell array 100 may include the plurality of memory blocks (MB1 to MBk) 110. The memory block 110 may include a plurality of strings ST11' to ST1m' and ST21' to ST2m'. Each of the plurality of strings ST11' to ST1m' and ST21' to ST2m' may extend in a vertical direction (e.g., Z direction). In the memory block 110, 'm' strings may be arranged in a row direction (e.g., X direction). Although FIG. 5 illustrates two strings arranged in a column direction (e.g., Y direction), three or more strings may be arranged in the column direction (e.g., Y direction) in other embodiments.

Each of the plurality of strings ST11' to ST1m' and ST21' to ST2m' may include at least one source select transistor SST, the first to nth memory cells MC1 to MCn, and at least one drain select transistor DST.

The source select transistor SST of each string may be coupled between the source line SL and the memory cells MC1 to MCn. Source select transistors of strings arranged in the same row may be coupled to the same source select line. Source select transistors of the strings ST11' to ST1m' in the first row may be coupled to the first source select line SSL1. Source select transistors of the strings ST21' to ST2m' in the second row may be coupled to the second source select line SSL2. In accordance with another embodiment, the source select transistors of the strings ST11' to ST1m' and ST21' to ST2m' may be coupled commonly to one source select line.

The first to nth memory cells MC1 to MCn of each string may be coupled in series between the source select transistor SST and the drain select transistor DST. Gates of the first to nth memory cells MC1 to MCn may be coupled to the first to nth word lines WL1 to WLn, respectively.

In accordance with an embodiment, at least one of the first to nth memory cells MC1 to MCn may serve as a dummy memory cell. When the dummy memory cell is provided, a voltage or current of the corresponding string may be stably controlled. As a result, the reliability of data stored in the memory block 110 may be improved.

The drain select transistor DST of each string may be coupled between the corresponding bit line and the memory cells MC1 to MCn. The drain select transistors DST of strings arranged in the row direction may be coupled to a drain select line extending in the row direction. The drain select transistors DST of the strings ST11' to ST1m' in the first row may be coupled to the first drain select line DSL1. The drain select transistors DST of the strings ST21' to ST2m' in the second row may be coupled to the second drain select line DSL2.

At least one source select transistor SST, the pipe transistor PT, and at least one drain select transistor DST as shown in FIGS. 4 and 5 may be programmed to have predetermined threshold voltages and turned on or off by operating voltages applied through the source select line SSL and the drain select line DSL during various operations including a program operation, a read operation, and an erase operation.

The CAM block 120 of FIG. 2 may be designed to have the same structure as the memory block 110 as shown in FIGS. 3 to 5.

Figure 6:
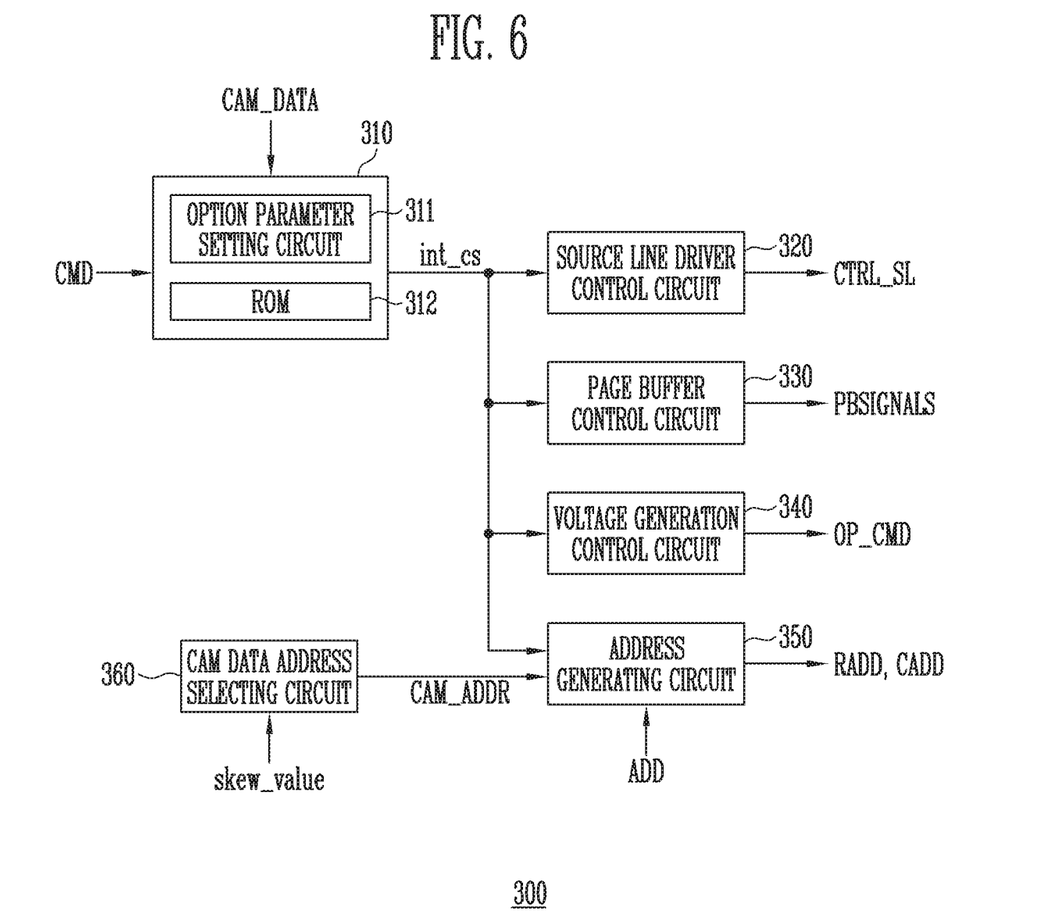
FIG. 6 is a block diagram illustrating a control logic in accordance with an embodiment of the present disclosure.

FIG. 6 is a block diagram illustrating a control logic in accordance with an embodiment of the present disclosure, for example, the control logic 300 of FIG. 2.

Referring to FIG. 6, the control logic 300 may include an internal control circuit 310, a source line driver control circuit 320, a page buffer control circuit 330, a voltage generation control circuit 340, an address generating circuit 350, and a CAM data address selecting circuit 360.

The internal control circuit 310 may include an option parameter setting circuit 311 and a read only memory (ROM) 312. The option parameter setting circuit 311 may set option parameters for various operations according to the CAM data CAM_DATA read during the CAM data read operation. The ROM 312 may store an algorithm for performing various operations (e.g., a program operation, a read operation, an erase operation, etc.) of a memory device. During various operations, the ROM 312 may generate and output an internal control signal int_cs in response to the internal command CMD and the option parameters. The internal command CMD may be input from an external device (e.g., the memory controller 1200 of FIG. 1). The option parameters may be set by the option parameter setting circuit 311.

The source line driver control circuit 320 may generate and output the source line control signal CTRL_SL for controlling the source line driver 270 of FIG. 2 in response to the internal control signal int_cs output from the internal control circuit 310. The source line control signal CTRL_SL may control the source line driver 270 of FIG. 2 to apply a source line voltage to the source line SL of the memory cell array 100.

The page buffer control circuit 330 may generate and output the page buffer control signals PBSIGNALS for controlling the page buffer group 230 of FIG. 2 in response to the internal control signal int_cs output from the internal control circuit 310.

The voltage generation control circuit 340 may generate and output the operation signal OP_CMD for controlling the voltage generating circuit 210 of FIG. 2 in response to the internal control signal int_cs output from the internal control circuit 310.

During various operations, the address generating circuit 350 may generate and output the row address RADD and the column address CADD in response to the internal control signal int_cs and the address ADD received from the input/output circuit 250. The internal control signal int_cs may be output from the internal control circuit 310. The address ADD may be received from the input/output circuit 250. During a CAM data read operation, the address generating circuit 350 may generate and output the row address RADD and the column address CADD corresponding to CAM data, selected from among the plurality of CAM data, in response to the internal control signal int_cs and a CAM data address CAM_ADDR. The corresponding CAM data may be selected from among the plurality of CAM data stored in the CAM block 120 of FIG. 2. The CAM data address CAM_ADDR may be output from the CAM data address selecting circuit 360 during a CAM data read operation.

The CAM data address selecting circuit 360 may output the CAM data address CAM_ADDR in response to the skew value signal skew_value. The skew value signal skew_value may be output from the parameter determining circuit 500 of FIG. 2. The CAM data address selecting circuit 360 may store a plurality of CAM data addresses CAM_ADDR corresponding to the plurality of CAM data stored in the CAM block 120, respectively. Further, the CAM data address selecting circuit 360 may select and output the CAM data address CAM_ADDR of the CAM data in which option parameter information optimized for the current skew value is stored, among the plurality of CAM data, in response to the skew value signal skew_value. For example, the CAM data address selecting circuit 360 may store the plurality of CAM data addresses CAM_ADDR corresponding to a plurality of skew values, and may select and output one of the plurality of CAM data addresses CAM_ADDR in response to the received skew value signal skew_value.

Figure 7:
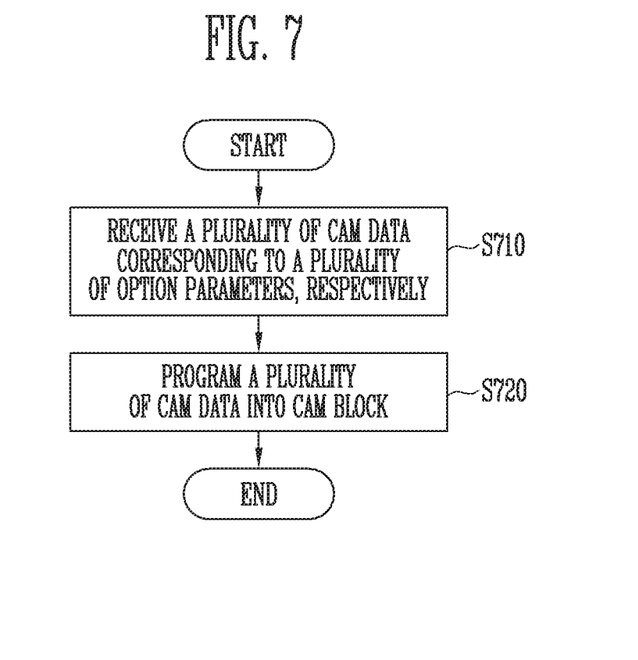
FIG. 7 is a flowchart illustrating a CAM data program operation in accordance with an embodiment of the present disclosure.

FIG. 7 is a flowchart illustrating a CAM data program operation in accordance with an embodiment of the present disclosure.

The CAM data program operation of FIG. 7 will be described below with reference to FIGS. 1 to 6.

Referring to FIG. 7, the memory device 1100 may receive a plurality of CAM data generated by the memory controller 1200 (S710). The plurality of CAM data may include a plurality of pieces of option parameter information corresponding to a plurality of skew values, respectively. For example, the plurality of CAM data includes first CAM data, second CAM data and third CAM data. The first CAM data may include option parameter information corresponding to a relatively slow skew value. The second CAM data may include option parameter information corresponding to a normal skew value. The third CAM data may include option parameter information corresponding to a relatively fast skew value. In this embodiment, the three CAM data are described as an example. However, skew values may be divided into more groups, and a plurality of CAM data corresponding thereto may be generated.

In addition, as described above in this embodiment, the memory controller 1200 may generate the plurality of CAM data. However, the plurality of CAM data may be received from the host 2000.

The memory device 1100 may program the CAM block 120 with the plurality of CAM data received from the memory controller 1200 (S720).

Figure 8A:
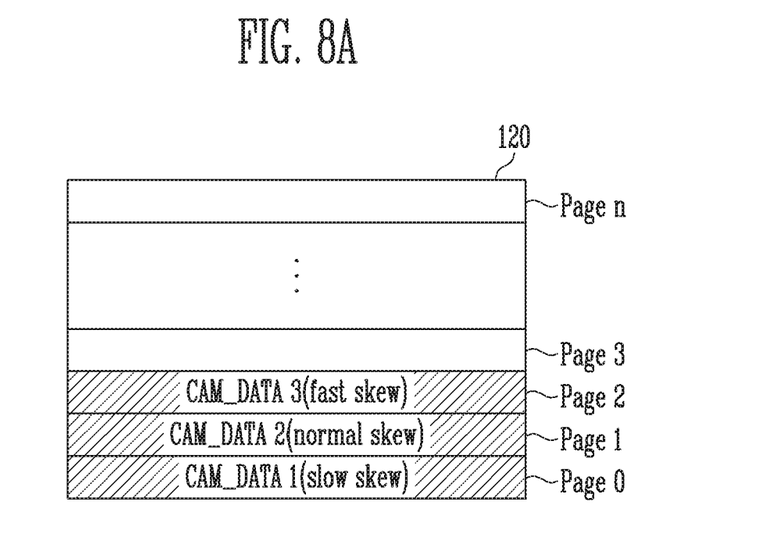
FIGS. 8A and 8B are diagrams illustrating a program method of CAM data in accordance with an embodiment of the present disclosure.
Figure 8B:
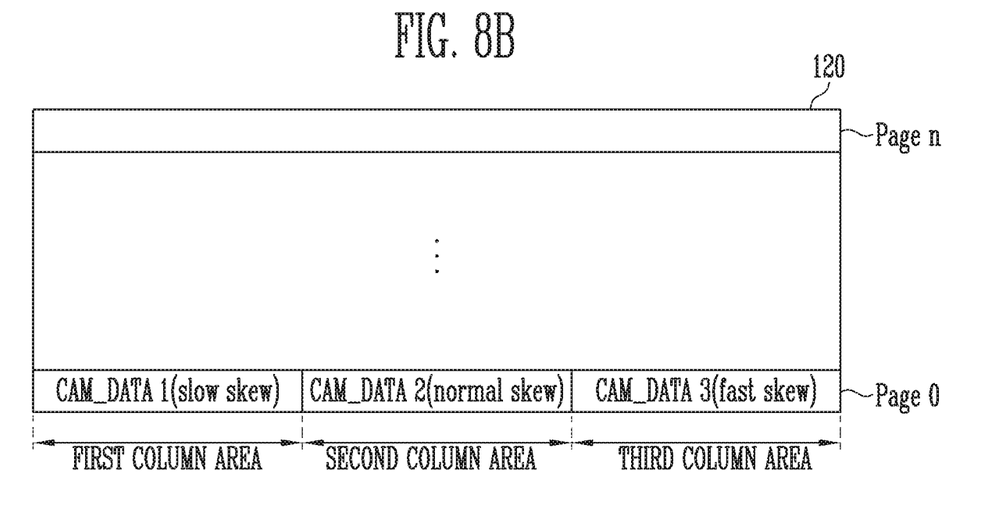

FIGS. 8A and 8B are diagrams illustrating a program method of CAM data in accordance with an embodiment of the present disclosure.

Referring to FIG. 8A, the CAM block 120 may include a plurality of pages Page 0 to Page n. One page may be selected from among the plurality of pages Page 0 to Page n of the CAM block 120. One selected page may be programmed with each of the plurality of CAM data during the CAM data program operation (at step S720 of FIG. 7). In other words, the plurality of CAM data may be programmed into different pages of the CAM block 120, respectively. For example, the plurality of CAM data includes first CAM data CAM_DATA 1 corresponding to a slow skew, the second CAM data CAM_DATA 2 corresponding to a normal skew and the third CAM data CAM_DATA 3 corresponding to a fast skew. The first CAM data CAM_DATA 1 (i.e., slow skew) may be stored in the page Page 0 of the CAM block 120. The second CAM data CAM_DATA 2 (i.e., normal skew) may be stored in the page Page 1 of the CAM block 120. The third CAM data CAM_DATA 3 (i.e., fast skew) may be stored in the page Page 2 of the CAM block 120. Different row addresses may be assigned to the first to third CAM data CAM_DATA 1 to CAM_DATA 3. The row addresses of the first to third CAM data CAM_DATA 1 to CAM_DATA 3 may be stored in the CAM data address selecting circuit 360 of the control logic 300.

Referring to FIG. 8B, during the CAM data program operation (at step S720 of FIG. 7), the plurality of CAM data may be programmed into one page (e.g., Page 0) of the CAM block 120. That is, the plurality of CAM data may be programmed into the same page of the CAM block 120. For example, the first CAM data CAM_DATA 1 (i.e., slow skew), the second CAM data CAM_DATA 2 (i.e., normal skew), and the third CAM data CAM_DATA 3 (i.e., fast skew) may be stored in the page Page 0 of the CAM block 120. Different column addresses may be assigned to the first to third CAM data CAM_DATA 1 to CAM_DATA 3. For example, the first CAM data CAM_DATA 1 (i.e., slow skew) may be stored in a first column area of the page Page 0, the second CAM data CAM_DATA 2 (i.e., normal skew) may be stored in a second column area of the page Page 0, and the third CAM data CAM_DATA 3 (i.e., fast skew) may be stored in a third column area of the page Page 0. The column addresses of the first to third CAM data CAM_DATA 1 to CAM_DATA 3 may be stored in the CAM data address selecting circuit 360 of the control logic 300.

As shown in FIG. 8B, the plurality of CAM data (e.g., first to third CAM data CAM_DATA 1 to CAM_DATA 3) may be stored in one page Page 0. However, as shown in FIG. 8A, while a plurality of CAM data are stored in a plurality of pages, at least one CAM data may be stored in each of the pages.

Figure 9:
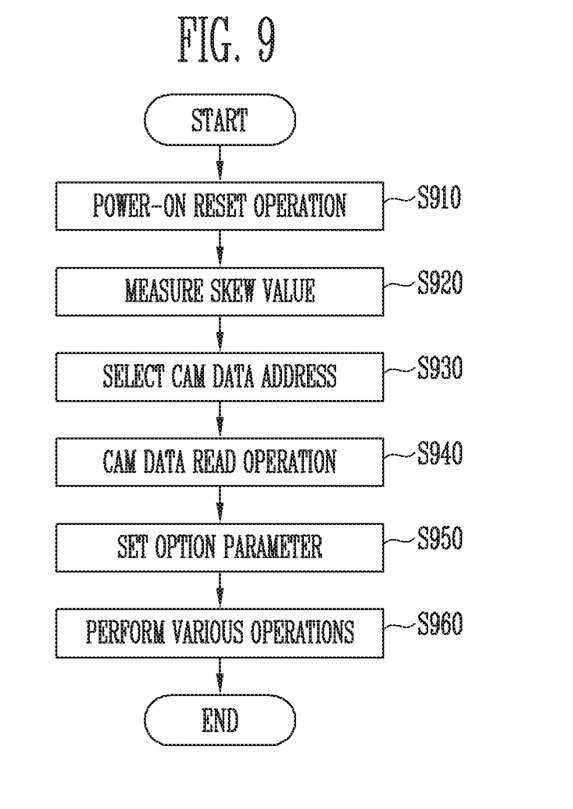
FIG. 9 is a flowchart illustrating an operation of a memory device in accordance with an embodiment of the present disclosure.

FIG. 9 is a flowchart illustrating an operation of a memory device (e.g., the memory device 1100) in accordance with an embodiment of the present disclosure.

In this embodiment of the present disclosure, a case in which a plurality of CAM data are programmed into a plurality of pages, respectively, as shown in FIG. 8A will be described as an example.

The method of operating the memory device 1100 of FIG. 9 is described below with reference to FIGS. 1 to 8B.

Referring to FIG. 9, when the memory device 1100 is powered on, the memory device 1100 may perform a power-on reset operation if the external power voltage VCCE applied from the outside of the memory device 1100 is increased to more than a predetermined level (S910). The power-on reset circuit 400 may generate and output the power-on reset signal POR by detecting the increase of the external power voltage VCCE to more than the predetermined level. The control logic 300 may perform an initialization operation in response to the power-on reset signal POR.

The parameter determining circuit 500 may generate and output the skew value signal skew_value by measuring the skew value of the memory device 1100 in response to the power-on reset signal POR (S920). The ring oscillator circuit 510 of the parameter determining circuit 500 may determine the skew value of the memory device 1100. The skew value of the memory device 1100 may be determined by generating the clock signal CLK whose period is changed by reflecting the variations of process, voltage, and temperature (PVT) of elements, and measuring the period of the clock signal CLK. That is, the parameter determining circuit 500 may generate and output the skew value signal skew_value corresponding to the skew value determined according to the period of the clock generated by the ring oscillator circuit 510.

The CAM data address selecting circuit 360 may select and output the CAM data address CAM_ADDR in response to the skew value signal skew_value (S930). The CAM data address CAM_ADDR may correspond to CAM data included in the option parameter information. The option parameter information may correspond to the skew value measured by the parameter determining circuit 500. The skew value signal skew_value may be output from the parameter determining circuit 500 of FIG. 2. For example, when the measured skew value corresponds to the first CAM data (i.e., slow skew), the row address of the first CAM data (i.e., slow skew) may be selected and output as the CAM data address CAM_ADDR. When the measured skew value corresponds to the third CAM data CAM_DATA 3 (i.e., fast skew), the row address of the third CAM data CAM_DATA 3 (i.e., fast skew) may be selected and output as the CAM data address CAM_ADDR.

The control logic 300 may generate and output the operation signal OP_CMD, the row address RADD, the column address CADD, and the page buffer control signals PBSIGNALS for performing the CAM data read operation. The peripheral circuit 200 may perform the CAM data read operation on a page selected from among the plurality of pages Page 0 to Page 2 of the CAM block 120 in response to the control logic 300 (S940).

The voltage generating circuit 210 may generate and output a read voltage and a pass voltage in response to the operation signal OP_CMD. The row decoder 220 may apply a read voltage to a selected word line corresponding to the selected page, among the plurality of pages included in the CAM block 120, in response to the row address RADD and may apply a pass voltage to unselected word lines. The page buffer group 230 may sense the CAM data CAM_DATA stored in the selected page by sensing currents or voltages in the bit lines BL1 to BLn in response to the page buffer control signals PBSIGNALS. The column decoder 240 may transfer the CAM data CAM_DATA sensed by the page buffer group 230 to the input/output circuit 250 in response to the column address CADD. The input/output circuit 250 may transfer the CAM data CAM_DATA to the control logic 300.

The internal control circuit 310 of the control logic 300 may set option parameters for various operations of the memory device 1100 on the basis of the received CAM data CAM_DATA (S950). For example, option parameters may be set based on the CAM data CAM_DATA which is received. The option parameters may include potential levels of operating voltages used in various operations including a program operation, a read operation, and an erase operation. Further, the option parameters may include time of applying the operating voltages, and a start voltage and an end voltage of incremental step pulse program (ISPP) and incremental step pulse erase (ISPE).

After setting the option parameters, the control logic 300 may perform various operations in response to the internal command CMD and the address ADD from the memory controller 1200 (S960).

In accordance with an embodiment of the present disclosure as described above, the memory device 1100 may measure a skew value of the memory device 1100 during a power-on operation, read CAM data corresponding to the measured skew value, among the plurality of CAM data, and set an option parameter for the various operations according to the read CAM data. Accordingly, an optimal option parameter may be set depending on characteristics of a memory device.

In addition, when the memory system 1000 includes a plurality of memory device 1100, the same or different option parameters may be set according to skew values of the plurality of memory devices 1100. Since optimal option parameters are set according to the skew values of the respective memory devices 1100, the accuracy of the various operations of the memory devices 1100 may be improved.

Figure 10:
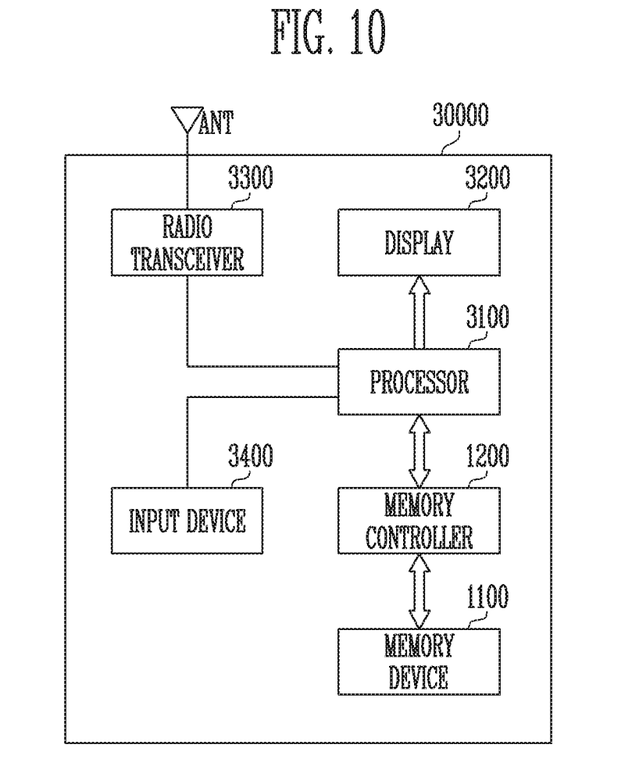
FIG. 10 is a diagram illustrating a memory system in accordance with an embodiment of the present disclosure.

FIG. 10 is a diagram illustrating a memory system 30000 in accordance with an embodiment of the present disclosure.

Referring to FIG. 10, the memory system 30000 may be embodied into a cellular phone, a smart phone, a tablet personal computer (PC), a personal digital assistant (PDA), or a wireless communication device. The memory system 30000 may include the memory device 1100 and the memory controller 1200 controlling the operations of the memory device 1100. The memory controller 1200 may control a data access operation of the memory device 1100, for example, a program operation, an erase operation, or a read operation in response to control of a processor 3100.

The memory controller 1200 may control data programmed into the memory device 1100 to be output through a display 3200 in response to control of the memory controller 1200.

A radio transceiver 3300 may exchange a radio signal through an antenna ANT. For example, the radio transceiver 3300 may change the radio signal received through the antenna ANT into a signal which can be processed by the processor 3100. Therefore, the processor 3100 may process the signal output from the radio transceiver 3300 and transfer the processed signal to the memory controller 1200 or the display 3200. The memory controller 1200 may program the signal processed by the processor 3100 into the memory device 1100. In addition, the radio transceiver 3300 may change a signal output from the processor 3100 into a radio signal and output the radio signal to an external device through the antenna ANT. A control signal for controlling the operations of the processor 3100 or data to be processed by the processor 3100 may be input by the input device 3400, and the input device 3400 may include a pointing device, such as a touch pad, a computer mouse, a keypad, or a keyboard. The processor 3100 may control the operations of the display 3200 so that data output from the memory controller 1200, data output from the radio transceiver 3300, or data output from an input device 3400 may be output through the display 3200.

In accordance with an embodiment, the memory controller 1200 controlling the operations of the memory device 1100 may form part of the processor 3100, or may be formed as a separate chip from the processor 3100. In addition, the memory controller 1200 may be formed as the example of the memory controller of FIG. 1, and the memory device 1100 may be formed as the example of the memory device of FIG. 2.

Figure 11:
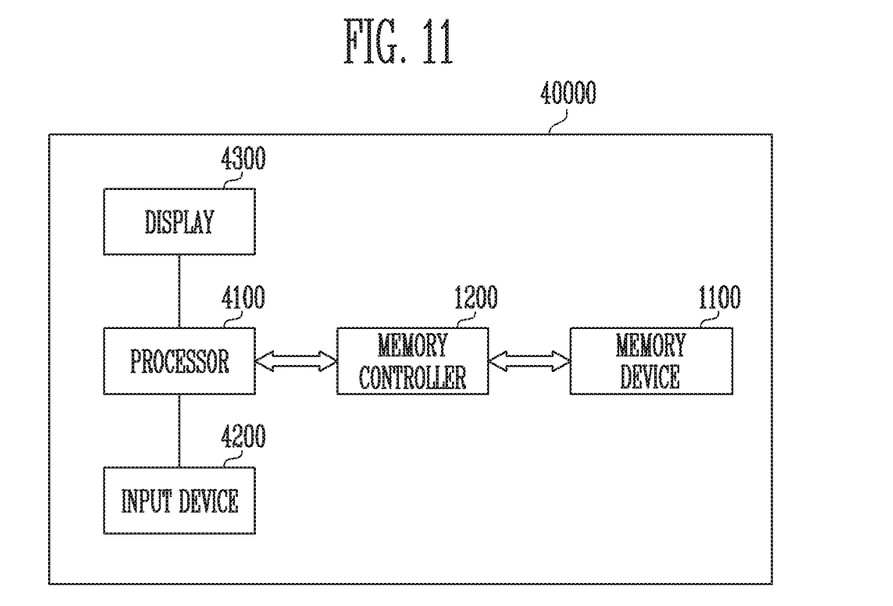
FIG. 11 is a diagram illustrating a memory system in accordance with an embodiment of the present disclosure.

FIG. 11 is a diagram illustrating a memory system 40000 in accordance with an embodiment of the present disclosure.

Referring to FIG. 11, the memory system 40000 may be embodied into a personal computer (PC), a tablet PC, a net-book, an e-reader, a personal digital assistant (PDA), a portable multimedia player (PMP), an MP3 player, or an MP4 player.

The memory system 40000 may include the memory device 1100 and the memory controller 1200 controlling a data processing operation of the memory device 1100.

A processor 4100 may output data stored in the memory device 1100 through a display 4300 according to data input through an input device 4200. Examples of the input device 4200 may include a pointing device such as a touch pad, a computer mouse, a keypad, or a keyboard.

The processor 4100 may control various operations of the memory system 40000 and control the operations of the memory controller 1200. In accordance with an embodiment, the memory controller 1200 controlling the operations of the memory device 1100 may be part of the processor 4100, or be formed as a separate chip from the processor 4100. In addition, the memory controller 1200 may be formed through the example of the memory controller of FIG. 1, and the memory device 1100 may be formed through the example of the memory device 1100 of FIG. 2.

Figure 12:
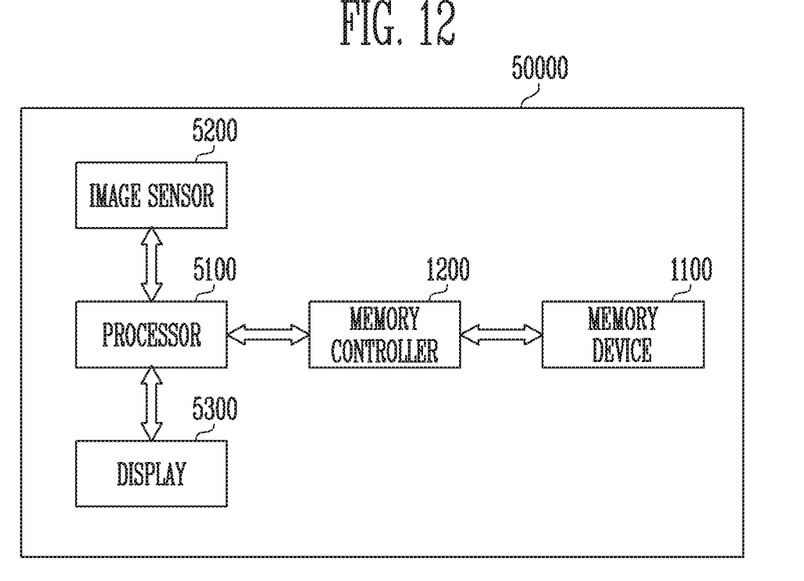
FIG. 12 is a diagram illustrating a memory system in accordance with an embodiment of the present disclosure.

FIG. 12 is a diagram illustrating a memory system 50000 in accordance with an embodiment of the present disclosure.

Referring to FIG. 12, the memory system 50000 may be embodied into an image processor, for example, a digital camera, a cellular phone with a digital camera attached thereto, a smart phone with a digital camera attached thereto, or a table PC with a digital camera attached thereto.

The memory system 50000 may include the memory device 1100 and the memory controller 1200 controlling a data processing operation of the memory device 1100, for example, a program operation, an erase operation or a read operation.

An image sensor 5200 of the memory system 50000 may convert an optical image into digital signals, and the digital signals may be transferred to a processor 5100 or the memory controller 1200. In response to control of the processor 5100, the digital signals may be output through a display 5300 or stored in the memory device 1100 through the memory controller 1200. In addition, the data stored in the memory device 1100 may be output through the display 5300 according to control of the processor 5100 or the memory controller 1200.

In accordance with an embodiment, the memory controller 1200 controlling the operations of the memory device 1100 may be part of the processor 5100, or be formed as a separate chip from the processor 5100. In addition, the memory controller 1200 may be formed as the example of the memory controller of FIG. 1, and the memory device 1100 may be formed as the example of the memory device of FIG. 2.

Figure 13:
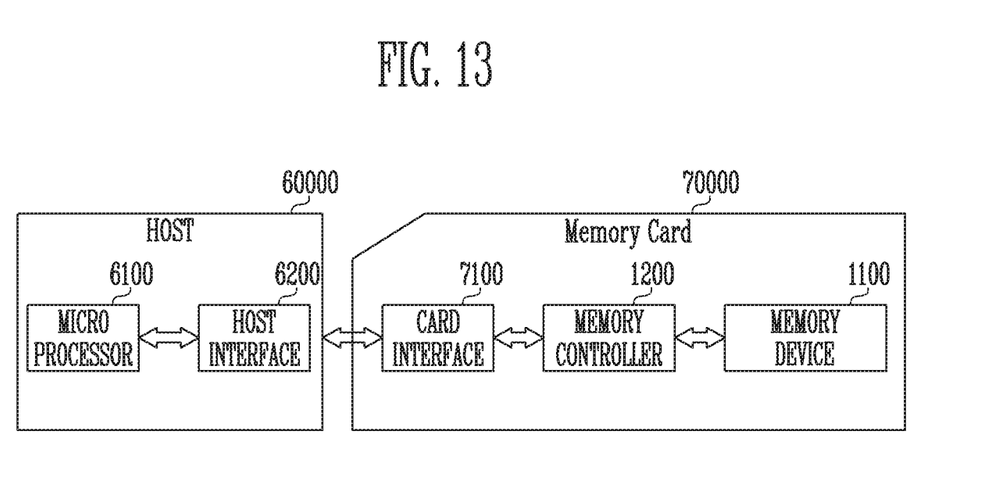
FIG. 13 is a diagram illustrating a memory system in accordance with an embodiment of the present disclosure.

FIG. 13 is a diagram illustrating a memory system 70000 in accordance with an embodiment of the present disclosure.

Referring to FIG. 13, the memory system 70000 may include a memory card or a smart card. The memory system 70000 may include the memory device 1100, the memory controller 1200, and a card interface 7100.

The memory controller 1200 may control data exchange between the memory device 1100 and the card interface 7100. In accordance with an embodiment, the card interface 7100 may be, but not limited thereto, a secure digital (SD) card interface or a multi-media card (MMC) interface.

The card interface 7100 may interface data exchange between a host 60000 and the memory controller 1200 according to a protocol of the host 60000. In accordance with an embodiment, the card interface 7100 may support a Universal Serial Bus (USB) protocol and an InterChip (IC)-USB protocol. The card interface 7100 may refer to hardware capable of supporting a protocol which is used by the host 60000, software installed in the hardware, or a signal transmission method.

When the memory system 70000 is connected to an host interface 6200 of the host 60000 such as a personal computer (PC), a tablet PC, a digital camera, a digital audio player, a cellular phone, a console video game hardware, or a digital set-top pox, the host interface 6200 may perform data communication with the memory device 1100 through the card interface 7100 and the memory controller 1200 in response to control of a microprocessor 6100. In addition, the memory controller 1200 may be formed as the example of the memory controller of FIG. 1, and the memory device 1100 may be formed as the example of the memory device of FIG. 2.

In accordance with the present disclosure, a CAM block of a memory device may be programmed with CAM data corresponding to a plurality of option parameter settings, and an option parameter may be set by reading CAM data, selected from among the CAM data, according to a skew value of the memory device, so that an option parameter optimized for the memory device may be set.

It will be apparent to those skilled in the art that various modifications can be made to the above-described exemplary embodiments of the present invention without departing from the spirit or scope of the invention. Thus, it is intended that the present invention cover all such modifications provided the modifications come within the scope of the appended claims and their equivalents.

It should be understood that many variations and modifications of the basic inventive concept described herein will still fall within the spirit and scope of the present disclosure as defined in the accompanying claims and equivalents thereof.

In the above-discussed embodiments, all steps may be selectively performed or skipped. In addition, the steps in each embodiment may not always be performed in regular order. Furthermore, the embodiments disclosed in the present specification and the drawings, aim to help those with ordinary knowledge in this art more clearly understand the present disclosure rather than aiming to limit the bounds of the present disclosure. That is, one of ordinary skill in the art to which the present disclosure belongs will be able to easily understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic inventive concept described herein will still fall within the spirit and scope of the present disclosure as defined in the accompanying claims and equivalents thereof.

What is claimed is:

1. A memory device, comprising:
    a memory cell array configured to include a plurality of memory blocks and a storage block storing a plurality of pieces of option parameter information;
    a parameter determining circuit configured to output a parameter information signal indicating a skew value determined by comparing a clock signal with a reference clock which has a preset period;
    a peripheral circuit configured to perform an operation on at least one selected memory block among the plurality of memory blocks or perform a parameter read operation on the storage block; and
    a control logic configured to control the peripheral circuit to obtain a selected piece of option parameter information according to the parameter information signal and control the peripheral circuit to perform the operation based on the selected piece of option parameter information.

2. The memory device of claim 1, wherein the parameter determining circuit comprises:
    a ring oscillator configured to generate the clock signal having a period changed by reflecting variations in process, voltage and temperature (PVT) of elements; and
    a clock skew measuring circuit configured to measure the skew value by using the clock signal to output the parameter information signal.

3. The memory device of claim 2, wherein the clock skew measuring circuit counts the number of toggles of the clock signal for a predetermined time and measures the skew value in response to the counted number of toggles.

4. The memory device of claim 3, wherein the clock skew measuring circuit measures the skew value by comparing the reference clock with the clock signal.

5. The memory device of claim 1, wherein the control logic comprises an address selecting circuit configured to select one of a plurality of addresses corresponding to the plurality of pieces of option parameter information in response to the parameter information signal.

6. The memory device of claim 5, wherein the control logic comprises:
an internal control circuit configured to generate an internal control signal in response to an internal command; and
control circuits configured to generate control signals for controlling the peripheral circuit in response to the internal control signal.

7. The memory device of claim 6, wherein the internal control circuit comprises:
an option parameter setting circuit configured to set an option parameter according to the selected piece of option parameter information; and
a read only memory (ROM) configured to store an algorithm for performing the various operations, and to generate the internal control signal in response to the internal command and the option parameter.

8. The memory device of claim 6, wherein the control circuits include an address generating circuit configured to generate a row address and a column address corresponding to the selected piece of option parameter information in response to the internal control signal and an address.

9. The memory device of claim 1, wherein the storage block comprises a Content Addressable Memory (CAM) block including a plurality of pages, and
wherein each of the plurality of pieces of option parameter information is stored in each of the plurality of pages.

10. The memory device of claim 1, wherein the storage block comprises a CAM block including at least one page, and
wherein the plurality of pieces of option parameter information are stored in the at least one page.

11. A memory device, comprising:
a memory cell array configured to include a plurality of memory blocks;
a skew determination circuit configured to count a number of toggles of a clock signal generated at power-on operation for a predetermined time, and generate a skew value corresponding to the difference between a period calculated using the number of toggles of the clock signal and a predetermined toggle period;
a peripheral circuit configured to perform a program operation on at least one selected memory block among the plurality of memory blocks; and
a control logic configured to control the peripheral circuit to perform the program operation using program voltages corresponding to the skew value.

12. The memory device of claim 11, wherein the skew determination circuit comprises:
a ring oscillator configured to generate the clock signal having a period changed by reflecting variations in process, voltage and temperature (PVT) of elements; and
a clock skew measuring circuit configured to output the skew value signal in response to the clock signal.

13. The memory device of claim 11, wherein the memory cell array further includes a CAM block storing CAM data.

14. The memory device of claim 11, wherein the control logic comprises:
an internal control circuit configured to generate an internal control signal in response to an internal command; and
control circuits configured to generate control signals for controlling the peripheral circuit in response to the internal control signal.

15. The memory device of claim 13, wherein the control logic includes a CAM data address selecting circuit configured to output one of a plurality of CAM data addresses corresponding to the CAM data, respectively.

16. The memory device of claim 13, wherein the CAM data correspond to the program voltages.

17. A method of operating a memory device, the method comprising:
storing CAM data corresponding to a plurality of option parameters in a CAM block;
outputting a skew value signal indicating a skew value determined by comparing a clock signal with a reference clock which has a preset period during a power-on operation;
performing a CAM data read operation on the CAM block;
obtaining read CAM data according to the skew value signal, from a result of the CAM data read operation; and
performing operations based on the read CAM data,
wherein the plurality of option parameters include voltage levels of operating voltages used in the operations, and application time of the operating voltages.

18. The method of claim 17, wherein the CAM block includes a plurality of pages, and
wherein each of the plurality of CAM data is stored in each of the plurality of pages, or the plurality of CAM data are stored in one of the plurality of pages.

19. The method of claim 17, wherein the outputting the skew value signal comprises determining a period of the clock signal generated by a ring oscillator.

* * * * *